United States Patent
Lee et al.

(10) Patent No.: US 6,436,816 B1
(45) Date of Patent: Aug. 20, 2002

(54) METHOD OF ELECTROLESS PLATING COPPER ON NITRIDE BARRIER

(75) Inventors: Chwan-Ying Lee, Tainan; Tzuen-Hsi Huang, Tou Liu, both of (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/127,463

(22) Filed: Jul. 31, 1998

(51) Int. Cl.$^7$ .......................................... H01L 21/4763

(52) U.S. Cl. .................... 438/643; 438/644; 438/651; 438/654; 438/664; 438/669; 438/674; 438/677; 438/678; 438/688

(58) Field of Search ................................. 438/678, 674, 438/677, 664, 686, 651, 627, 643, 628, 644, 654, 669, 688, 614

(56) References Cited

U.S. PATENT DOCUMENTS

| | | | |
|---|---|---|---|
| 3,562,005 A | * | 2/1971 | De Angelo et al. |
| RE29,015 E | * | 10/1976 | De Angelo et al. |
| 4,122,215 A | * | 10/1978 | Vratny |
| 4,182,781 A | | 1/1980 | Hooper et al. ............... 427/90 |
| 4,284,660 A | * | 8/1981 | Donaghy et al. |
| 4,778,563 A | * | 10/1988 | Stone |
| 4,954,214 A | * | 9/1990 | Ho |

(List continued on next page.)

FOREIGN PATENT DOCUMENTS

| | | | | |
|---|---|---|---|---|
| JP | 6145994 A | * | 5/1994 | |
| JP | 6280031 A | * | 10/1994 | |
| JP | 1019934 A | * | 1/1998 | |
| JP | 63318754 A | * | 12/1998 | |

OTHER PUBLICATIONS

Jiang Tao, Nathan W. Cheung, Chenming Hu, H.K. Kang and S. Simon Wong, Electromigration Performance of Electroless Plated Copper/Pd–Silicide Metallization, IEEE Electron Deviced Letters, vol. 13, No. 8, Aug. 1992, pp. 433–435.*

Dubin et al. "Selective electroless Ni deposition on a TiW underlayer for integrated circuit fabrication" Thin Solid Films, 226(1993) p 87–93.

Primary Examiner—George Fourson
Assistant Examiner—Michelle Estrada
(74) Attorney, Agent, or Firm—George O. Saile; Stephen B. Ackerman; William J. Stoffel

(57) ABSTRACT

A method with three embodiments of manufacturing metal lines and solder bumps using electroless deposition techniques. The first embodiment uses a PdSi$_x$ seed layer 50 for electroless deposition. The PdSi$_x$ layer 50 does not require activation. A metal line is formed on a barrier layer 20 and an adhesion layer 30. A Palladium silicide seed layer 50 is then formed and patterned. Ni, Pd or Cu is electroless deposited over the Palladium silicide layer 50 to form a metal line. The second embodiment selectively electrolessly deposits metal 140 over an Adhesion layer 130 composed of Poly Si, Al, or Ti. A photoresist pattern 132 is formed over the adhesion layer. A metal layer 140 of Cu or Ni is electrolessly deposited over the adhesion layer. The photoresist layer 132 is removed and the exposed portion of the adhesion layer 130 and the underlying barrier metal layer 120 are etched thereby forming a metal line. The third embodiment electroless deposits metal over a metal barrier layer that is roughen by chemical mechanical polishing. A solder bump is formed using an electroless deposition of Cu or Ni by: depositing an Al layer 220 and a barrier metal layer 230 over a substrate 10. The barrier layer 230 is polished and activated. Next, the aluminum layer 220 and the barrier metal layer 230 are patterned. A metal layer 240 is electroless deposited. Next a solder bump 250 is formed over the electroless metal layer 240.

14 Claims, 4 Drawing Sheets

U.S. PATENT DOCUMENTS

| | | | |
|---|---|---|---|
| 5,169,680 A | 12/1992 | Ting et al. | ................... 427/96 |
| 5,183,795 A | 2/1993 | Ting et al. | ................. 437/230 |
| 5,292,361 A * | 3/1994 | Otsuka et al. | |
| 5,300,330 A * | 4/1994 | Feldstein et al. | |
| 5,358,907 A * | 10/1994 | Wong | |
| 5,429,994 A | 7/1995 | Ishikawa | ................... 437/230 |
| 5,580,668 A | 12/1996 | Kellam | ..................... 428/610 |
| 5,583,073 A * | 12/1996 | Lin et al. | |
| 5,795,828 A * | 8/1998 | Endo et al. | |
| 5,917,244 A * | 6/1999 | Lee et al. | |
| 5,989,993 A * | 11/1999 | Zakel et al. | |
| 6,030,877 A * | 2/2000 | Lee et al. | |
| 6,042,889 A * | 3/2000 | Ballard et al. | |
| 6,127,249 A * | 10/2000 | Hu | |
| 6,156,413 A * | 12/2000 | Tomari et al. | |
| 6,180,523 B1 * | 1/2001 | Lee et al. | |
| 6,221,440 B1 * | 4/2001 | Meyer et al. | |

* cited by examiner

METHOD OF ELECTROLESS PLATING COPPER ON NITRIDE BARRIER

BACKGROUND OF INVENTION

1) Field of the Invention

The present invention relates to electroless plating and more particularly to the electroless plating of Cu and Ni in semiconductor wires and bumps. It also relates to the formation of high-resolution conductive wiring patterns on semiconductor and advanced packaging substrates.

2) Description of the Prior Art

Electroless plating is a method used to deposit a thin film or a layer of some material on a substrate. The principal step is the immersion of the substrate in a plating bath containing ions of the material to be deposited, causing some of these ions to precipitate at the substrate's surface. Unlike electroplating methods, electroless plating does not require an externally applied electric field to facilitate the ion deposition process. The electroless plating may be selective, i.e., the deposition may occur only at locations that exhibit appropriate electrochemical properties. For example, the ions may be deposited mainly on those portions of the substrate that are made of a material identical (or exhibiting affinity) to the material being deposited. Another of many possibilities is that portions of the substrate may be treated or activated with a catalyst to cause the ion deposition to occur at a rapid rate. The material or catalyst present in the selected areas before the deposition is sometimes referred to as "seed material" or "seed layer". The ratio of the deposition rate on the activated regions to the deposition rate at the non-activated regions is referred to as the "plating process selectivity". The deposition rate may also depend on the physical characteristics of the activated areas, e.g., their sizes, aspect ratios, and distances separating them. If the thickness of the material deposited in various locations at the substrate is similar, the plating process is said to be uniform. For many applications, it is crucial that the plating process be uniform, that it exhibit high selectivity, and that the deposited film strongly adheres to the substrate.

One of the ways to increase the adhesion is to subject the plated artifact to an annealing process. The conditions or process parameters such as the temperature, ion concentration in the plating path, and duration of the bath, which provide desirable uniformity, selectivity, and some physical properties of the deposited layer usually fall within certain ranges, the combination of which is called a "technological process window". To insure the repeatability and consistency of the plating process, it is desirable that the process window be as large as possible.

Electroless plating of solid metals from a solution containing metal ions onto a catalytically active surface has been widely used in the printed circuit board industry for production of wiring layers and inter-layer (via) connections. More recently, this body of knowledge has been applied to producing metal interconnect films in the integrated circuit (IC) industry. The electroless plating technique has several advantages over other well known metal deposition techniques such as sputtering and evaporation. One advantage is that the electroless plating process uses materials and capital equipment that are inexpensive compared to the other methods. Another advantage is that the technique deposits films only in selected, catalytically active regions. This property of selective growth allows the user to reduce the number of lithographic patterning and etching steps used to define the regions to be covered by the deposited metal. It also facilitates dense patterning of materials such as copper, that are difficult to etch anisotropically. Yet another advantage is that the growth rate of the deposited metal is relatively independent of the angles or relative heights of topographic features on the substrate being plated. This property enables deposition into features having high aspect ratios, such as deep via holes on multi-layer circuit boards, that could not be uniformly covered by the "line of sight" deposition techniques such as sputtering and evaporation.

The most commonly published use of electroless plating in the integrated circuit industry is for filling contact or via holes. The traditional contact is a hole, patterned and etched in a dielectric film placed on top of a conducting film so that the surface of the conducting film is exposed within the hole. An upper level of conductor, patterned over the contact hole, makes a physical and electrical contact with the lower conductor in the contact region. Electroless plating has been used to grow metal selectively onto the surface of the lower conductor that is exposed in the contact hole. This produces a metallic "plug" which electrically couples the upper conductor to the lower conductor. The "plug" is plated until its top surface substantially coincides with the top surface of the dielectric, and the resulting planarity of the structure prevents problems that might occur in the subsequent processing if topographic variations were present in the vicinity of the contact region.

Although electroless plating-based processes, such as contact-hole filling, offer many advantages to the process designer, the technique has only found limited acceptance within the IC manufacturing community. Although the technique appears to be relatively simple, the chemical reactions occurring at the plated surface can be complex. Some of the factors inhibiting the wider application of electroless plating are the difficulties in controlling the plating process and in obtaining uniform plating thickness on the entire substrate, as well as the sensitivity to contaminants exhibited by the process. Many of these problems are related to the previously known surface activation techniques, i.e., methods used to render the plated surface catalytically active. The present invention teaches a new surface preparation technique that provides a more active surface on which to plate, thereby improving the latitude of the plating process and the uniformity of the plated materials.

Many surface activation techniques have been reported in both the patent and scientific literature. Frequently, these techniques are designed for plating a specific material onto a specific substrate material, and rely on certain properties of these materials. The most common applications of electroless plating to integrated circuit manufacturing comprise plating of nickel, cobalt, palladium, or copper onto one of two types of substrate surfaces. The first type of substrate surface comprises conductive regions of substrates that are generally formed of silicon, aluminum, or aluminum alloys. The second type of substrate comprises a non-conductor such as silicon dioxide or a polymeric insulator. The reported surface activation techniques applied to these substrates usually fall into one of three categories: (1) catalyst film deposition by evaporation or sputtering, (2) catalyst film deposition by electrochemical surface modification, and (3) catalytic film deposition from a colloidal suspension.

Palladium and platinum are frequently used as catalytic surface activators in electroless plating methods. Catalytic films of palladium or platinum for subsequent electroless plating can be readily deposited by evaporation or sputtering techniques. The films deposited with these techniques can be patterned by well known lithographic techniques, e.g., subtractive etching or liftoff. Large features and/or dense patterns of small features are relatively easy to plate with this method.

It has been reported that the catalytic activity of palladium films deposited by evaporation and sputtering is lower than that of palladium films deposited by other techniques, for example electrochemically deposited films. This low activity has a significant detrimental impact on the uniformity of structures formed by this process and on the resulting yield. Features that are small or separated with large distances from other features are significantly more difficult to plate. These size-dependent and proximity-dependent effects are often related to the presence of stabilizing agents (stabilizers) in the plating solutions. Stabilizers are added to most commercially available plating solutions to prevent the spontaneous decomposition of the plating bath. Generally, the stabilizers reduce or even prevent the auto-catalytic plating reaction from occurring on small particles that may be present in the bath. The presence of such particles may result from a contamination of the plating bath with the airborne dust. The stabilizing agents also exert a significant and beneficial impact on the electrical and mechanical properties of the deposited film, although the mechanisms for this action are not always clearly understood. It is intuitively clear, however, that any mechanism that prevents undesirable auto-catalytic plating on small particles in the bath may also impede the desirable plating of small, isolated features present on the substrate. Plating of small features may be enhanced by modifying the bath composition or process conditions. For instance, the ability to plate sub-micrometer features can be improved by raising the plating bath temperature, or by reducing the amount of the stabilizing agents in the bath. This improvement is obtained the price of a reduced plating selectivity and reduced bath stability.

The plating non-uniformity and process selectivity also depend on the detailed history of the catalytic surface. Subjecting this surface to any post-patterning clean-up processes or exposing it to air before plating reduce the ability to uniformity plate the desired features.

A wide range of electrochemical surface modification techniques to enable the catalytic plating on metallic and dielectric materials have been disclosed. Aluminum films used in VLSI circuits can be rendered catalytically active by electroless plating of a seed layer of palladium from a bath containing a dilute aqueous solution of $PdCl_2$ and HCl. Typically, the pre-existing aluminum oxide is removed by a short immersion in a dilute HF solution prior to the palladium activation. The degree of activation achieved by this technique depends strongly on the processing history of the aluminum surface, the concentration of the activator components, the temperature, and duration of the exposure of the aluminum surface of the activator. This method can achieve very high levels of activation, but suffers from a very small "process window". If the exposure to the activator solution is too brief, the insufficient surface activation and the resulting plating non-uniformity will occur. If the exposure to the activator solution is too long, the plated metal will exhibit poor adhesion. While this process has been demonstrated to work, the development of a stable, reproducible manufacturing implementation is difficult.

Another method of activating aluminum surfaces using the electroless deposition of zinc. The zinc is then used as a catalytic seed material for subsequent plating of the nickel film. This process is commonly refereed to as "zincating", and is extremely effective for activating larger dimension patterns but suffers from a reduced process window in the presence of features with small dimensions, such as used in many integrated circuits. The process exhibits a tradeoff between activation and adhesion similar to the one discussed above for palladium-based activation.

Conventionally, the conductor lines are formed by photolithography and dry etching of dielectric and metal layers. However, the Al—Si (or Al—Si—Cu) system does not satisfy many requirements, such as high thermal stability, low electromigration, and high corrosion resistance. Copper is a candidate for multilevel interconnection because of several properties that give it the potential advantages over Al. Unfortunately, copper is quite mobile in Si at elevated temperature and its presence in Si creates trap levels that are deleterious to device operation. For these reasons, it is necessary to determine which materials may act as effective diffusion barrier for copper migration. A suitable diffusion barrier should meet certain constrains:

a. slow transport rate of the substrate and the adjoining material across the barrier layer;

b. slow loss rate of barrier layer into the substrate and adjoining layer;

c. strong adhesion of barrier layer with substrate and with adjoining material;

d. the barrier layer should be laterally uniform in thickness and substrate;

e. the barrier layer should be thermodynamically stable against substrate and adjoining material;

f. the barrier layer should have low resistivity.

Electroless copper deposition technique is especially appealing because of low cost and low process temperature, high deposition rate and high quality of electroless Cu deposit. Electroless copper process can be described by two steps which occur simultaneously on the catalytic surface: 1) anodic oxidation of reducing agents and 2) cathodic reduction of metal ions. A catalytic layer is needed for electroless copper deposition to catalyze oxidation of reducing agents and to transport electrons from anodic sites of reaction to cathodic sites of reaction. Hence we must deposit another adhesion layer on the diffusion barrier layer because the surface of diffusion barrier is not autocatalytic.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,183,795(Ting): *Fully planar metalization process*—that teaches planar interconnect using selective, electroless deposition of a metal such as copper into interconnect channels. Channels are formed in the dielectric layers by patterning and etching the composite dielectric layers. Silicon atoms are implanted in the bottom of the interconnect channels and then the metal layer is selectively, electrolessly deposited to fill the channels in the first dielectric film, thus forming a level of interconnect.

U.S. Pat. No. 5,429,994 (Ishikawa): *Wiring forming method, wring restoring method and wiring pattern changing method*—shows a low-resistance metal layer is formed on the metal film by electroless plating.

U.S. Pat. No. 5,580,668(Kellam): *Aluminum-palladium alloy for initiation of electroless plating*—shows thin layers of aluminum (13) and palladium (12) that are deposited and annealed to produce aluminum-palladium alloy (14). The surface of the alloy (14) is exposed and treated with an aluminum etchant to produce a catalytic surface (15). The catalytic surface is used for electroless plating of nickel.

U.S. Pat. No. 4,182,781(Hooper): *Low cost method for forming elevated metal bumps on integrated circuit bodies employing an aluminum/palladium metallization base for electroless plating*—shows Elevated metal contact bumps provided on a microelectronic semiconductor circuit, with the use of aluminum-palladium metallization as a base for selective electroless plating. The aluminum-palladium film is then patterned in a single step, using an etchant which attacks both metals at substantially the same rate. The metal pattern is then covered with an insulation layer wherein apertures are opened to expose palladium at selected sites for immersion in an electroless plating bath of ionic Cu or Ni for bump formation.

U.S. Pat. No. 5,169,680 (Ting): *Electroless deposition for IC fabrication*—shows electroless deposition provides a selective and an additive process for forming conductive layers, filling window and providing interconnections and terminals. The conducting material is selectively deposited on a catalytic underlying surface. When the underlying surface is not catalytic, an activation step is used to cause the surface to be catalytic.

U.S. Pat. No. 4,954,214(Ho) shows an interconnect structure using Ni deposited by electroless deposition using a refractory metal seed layer.

Dubin, et al., *Selective Electroless Ni Deposition On A Tiw Underlayer For Integrated Circuit Fabrication,* Thin Solid Films, 226 (1993) pp. 87–93, discusses Ni electroless deposition on TiW layers.

SUMMARY OF THE INVENTION

It is an object of the present invention to provide a method for fabricating devices by Electroless Plating of ① Ni, Pd or Cu ② on a Nitride barrier layer.

It is an object of the present invention to provide a method for fabricating devices by Electroless Plating of ①Ni or Cu ② on Poly, or Al on adhesion layers which are deposited on TiN barrier layers.

It is an object of the present invention to provide a method for fabricating interconnections using Electroless Plating of Ni or Cu over a Pd silicide activation layer.

It is an object of the present invention to provide a method for fabricating devices by solder bumps using Electroless Plating of Cu for a solder bump.

It is an objective of the present invention to provide metal line formed by a selective electroless deposition process using Palladium Silicide (PdSix) a seed layer (e.g., Al, Ti or poly) or chemical-mechanical polish.

The invention provides three embodiments for electroless deposition.

The 1st embodiment uses a PdSix seed layer for electroless deposition of Cu, Ni, or Pd to form an interconnect.

The second embodiment uses a polysilicon, Ti or Al adhesion layer to electroless deposit Cu, Pd or Ni to form an interconnection.

The third embodiment uses a metal barrier layer, activated by CMP, to electroless deposit a Cu, Ni or Pd layer and then form a Pb—Sn bump thereover.

1st Embodiment—PdSix Seed Layer for Electroless Deposition

The first embodiment for a method for forming an interconnect by depositing selectively by electroless deposition a metal 60 using a palladium silicide seed layer 60 can be summarized as follows:

(a) step 100—FIG. 1A providing a semiconductor structure 10;
(b) step 102—FIG. 1A—forming a barrier layer 20 over the semiconductor structure 10; the barrier metal layer is composed of TiW, TN, MoN, WN, or TaN;
(c) Step 104—forming an Adhesion layer 30 over the Barrier metal layer 20, the adhesion layer composed of Polysilicon;
(d) step 106—FIG. 1B—sputter depositing a Palladium (Pd) layer 40 over the Adhesion layer 30;
(e) step 108 FIG. 1C—Annealing the Palladium (Pd) layer 40 to form a Palladium (Pd) Silicide layer 50;
  (e-1) the anneal to form the palladium silicide layer is performed at a temp between about 230 and 270° C. for a time between about 20 to 40 minutes; the anneal is performed in an ambient of $N_2$ and air;
(f) step 110—FIG. 1D—patterning the Palladium silicide layer 50 to form Palladium silicide interconnect patterns 50;
(g) step 112—FIG. 1D—patterning the barrier layer 20 using the Palladium silicide line patterns 50 as an etch mask forming barrier layer interconnect patterns;
(h) step 114—FIG. 1E—selectively electroless depositing a metal layer 60 on the Palladium silicide line patterns 50 to form an interconnect; the metal layer composed of a material selected from the group consisting of Ni, Cu, and Palladium (Pd) over the Palladium silicide interconnect patterns whereby the metal layer was deposited without activating the palladium silicide line.

2nd Embodiment—Electroless Depositing a Metal 140 Over Adhesion Layer 130 of Polysilicon, Al or Ti The Second embodiment provides a method of forming a metal line using an electroless deposition of Cu or Ni over an adhesion layer 130 composed of Polysilicon, Al, or Ti, comprising (a) FIG. 2F—Step 200—providing a semiconductor structure 10;
(b) step 200—depositing a Barrier metal layer 120 over the semiconductor structure 10;
  (e1) the barrier metal layer of a TiW, TN, MoN, WN, or TaN;
(c) FIG. 2A—step 204—depositing an Adhesion layer 130 over the Barrier metal layer 120, the adhesion layer 130 composed of a material selected from the group consisting of (a) Poly Si (b) Al and (c) Ti;
(d) step 206—forming a photoresist pattern 132 over the adhesion layer 130;
(e) step 208—pickling and activating the adhesion layer 130;
(f) step 210—electrolessly depositing a metal layer 140 over the adhesion layer, the metal layer 140 composed of a material selected from the group consisting of Cu, Pd and Ni,
(g) FIG. 2C—step 212—removing the photoresist layer 132 thereby exposing portions of the adhesion layer; and
(h) FIG. 2D—step 214—Dry etching the exposed portion of the adhesion layer 130 and the barrier layer 120; thereby forming a metal line 140 130 120.

3rd Embodiment—Electroless Deposition on a Metal Barrier Layer that is Roughed by CMP The third embodiment (See FIG. 3) teaches a method of forming a solder bump using an electroless metal deposition over an adhesion layer that is roughened by a polishing process comprising:

(a) FIG. 3—Step 300—providing a semiconductor structure 10;
(b) FIG. 3A—step 302, depositing an Aluminum layer 220 over the semiconductor structure 10;
(c) FIG. 3A step 304—depositing a barrier metal layer 220 over the Aluminum layer 230; the barrier metal layer of a material selected from the group consisting of TiW, TiN, MoN, WN, and TaN;

(d) FIG. 3B—step 306, polishing the barrier layer 230 to roughen the surface of the barrier layer;

(e) step 308—Patterning the aluminum layer 220 and the barrier metal layer 230;

(f) FIG. 3D step 310—pickling the surface of the barrier layer using an HF based pickling solution;

(g) FIG. 3D step 310—activating the surface of the barrier layer using a $PdCl_2$ activation solution comprised of: PdCl2 at a concentration between about 0.1 and 0.2 g/l, HF at a concentration between about 200 and 300 g/l, and acetic acid at a concentration between about 450 and 500 g/l;

(h) FIG. 3D—step 312—electroless depositing a metal layer 240 over the barrier layer 230;

(i) FIG. 3E—Step 314—depositing a Solder bump 250 over the electroless metal layer 240; the solder bump is composed of Pb—Sn.

The invention provides the following benefits:

The Three embodiments provide electroless depositing process for depositing Cu, Ni or Pd over ① PdSix, ② Polysilicon, Al, or Ti and ③ over a chemical-mechanical polished roughen metal layer.

less costly than other selective metal deposition processes.

More reproducible technique than prior art processes.

lower process temperature, high deposition rate and higher quality than prior art.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming metal lines and bumps.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

First Embodiment—Interconnect A—FIGS. 1A thru 1E, 1F

The table below summarizes the steps for the first embodiment.

TABLE

Summary of 1st embodiment

Figure 1A:
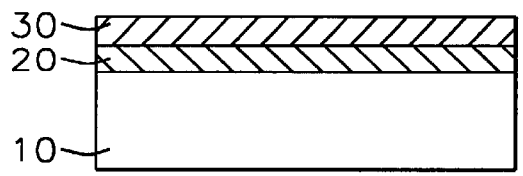
FIGS. 1A through 1E are cross sectional view for illustrating the 1st embodiment of the invention for forming a wire using electroless deposition.
Figure 1B:
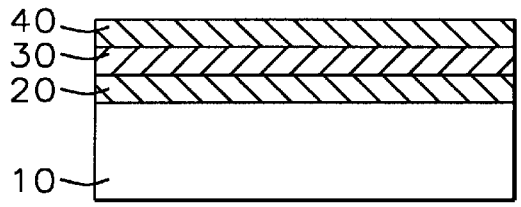

| | |
|---|---|
| First Embodiment | Metal lines 60 electroless deposited over Palladium silicide 50 |
| Step- | Process |
| step 100-FIG. 1A | providing a semiconductor structure 10; |
| step 102-FIG. 1A- | forming barrier layer 20 over the semiconductor structure 10; The barrier layer is deposited by Physical Vapor Deposition (PVD) or CVD process the barrier metal layer 20 composed of TiW, TiN, MoN, WN, or TaN; |
| Step 104 | form an Adhesion layer 30 over the Barrier metal layer 20, the adhesion layer composed of Polysilicon; |
| step 106-FIG. 1B- | sputter Palladium (Pd) layer 40 over the Adhesion layer 30; |

TABLE-continued

Summary of 1st embodiment

Figure 1C:
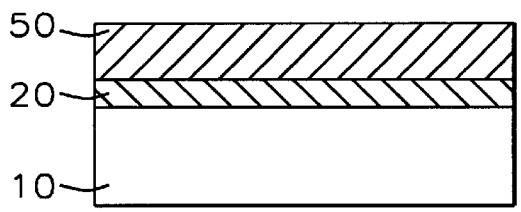
Figure 1D:
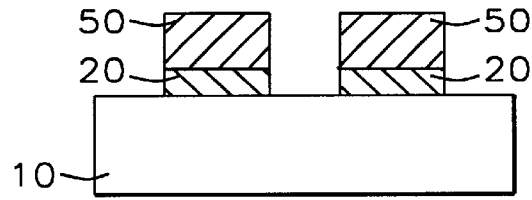
Figure 1E:
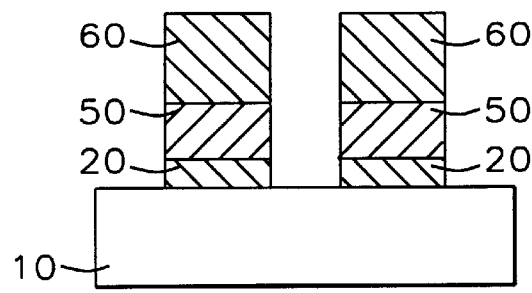
Figure 1F:
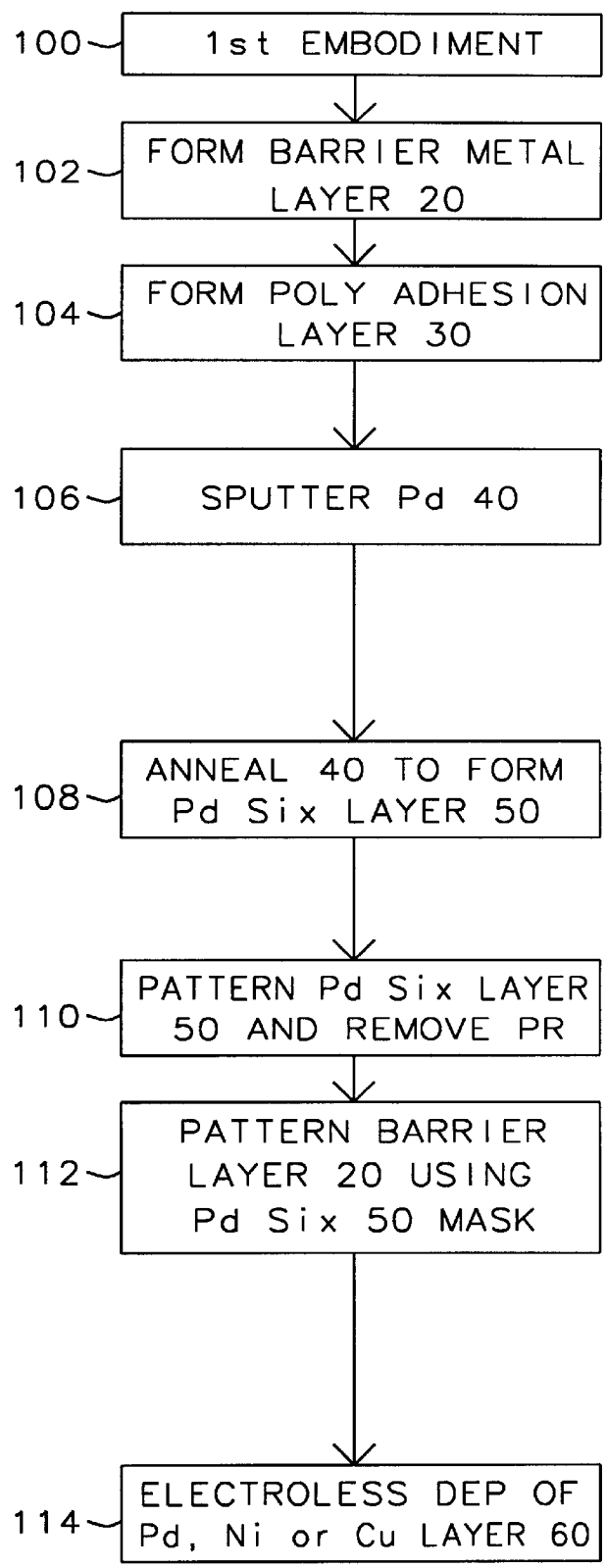
FIG. 1F is a flow chart of the process of the 1st embodiment of the invention for forming a wire using electroless deposition.

| First Embodiment | Metal lines 60 electroless deposited over Palladium silicide 50 |
|---|---|
| step 108 FIG. 1C- | Key step-Anneal the Pd layer 40 to form a Pd Silicide layer 50; the anneal at a temp between about 230 and 270° C. for a time between about 20 to 40 minutes in $N_2$ or air; |
| step 110-FIG. 1D- | pattern the Palladium silicide layer 50 to form Palladium silicide line patterns; |
| step 112-FIG. 1D | pattern the barrier layer using the Palladium silicide line patterns as an etch mask; |
| step 114-FIG. 1E- | electroless depositing a metal line 60 composed of a material selected from the group consisting of Ni or Cu over the Palladium silicide line patterns. A key feature of the electroless bath is the use of $NaH_2PO_2$ (Sodium hypophosphite) as the reducing agent. |

Note that in this invention, all parameters that have only one value (e.g., a target value) have low and high limits inferred as plus or minus 10% of the parameter (+/−10%). This does not mean that the parameter is not important or the process is not sensitive to the variations in the parameter, only that the parameter has a +/−10% limits. This is especially important for the parameters for the electroless baths. This will make the disclosure easier to read.

The table below indicates the key steps and their importance.

TABLE important elements of the interconnect of the first embodiment

| Step | FIG. | Reason step is important |
|---|---|---|
| 108 | 1C | PdSix is a superior catalytic material for electroless deposition *the $PdSi_x$ 50 is not activated by any process (e.g., activating solution, ion implant etc.) |
| 108 | 1C | The salicidation anneal temperature (step 108) is low and reaction can proceed in a oxygen atmosphere |
| 114 | 1E | Electroless Pd, Cu or Ni can selectively deposit on PdSix layer 50 |

The first embodiment to form an interconnect is shown in FIGS. 1A to 1E and 1F.

A semiconductor structure 10 is provided. The semiconductor structure can comprise a semiconductor substrate having devices formed therein and thereover, including, but not limited to conductive and insulating layers and regions.

A barrier metal layer 20 is deposited over the semiconductor structure 10 as shown in FIG. 1A. The barrier metal layer can be composed of TiW, TiN, MoN, WN or TaN and is preferably composed of TiW, TiN or MoN. The barrier layer 20 can be formed by Physical Vapor Deposition (PVD) or CVD and preferably has a thickness in a range of between about 300 and 500 Å.

The next step, (104) involves the deposition of the Polysilicon adhesion layer 30 preferably by LPCVD. The layer preferably has a thickness in a range of 1500 Å+/−20% and more preferably between 1400 and 1600 Å. FIG. 1A shows the resultant structure.

Step 106, involves Sputtering Palladium (Pd) 40 over Polysilicon layer 30. See FIG. 1B. The Palladium layer 40 preferably has a thickness in a range of between about 2000 and 2500 Å. FIG. 1C shows the resultant structure.

Step 108—Form Palladium Silicide (PdSix) Layer 40

Next, the Palladium (Pd) layer 40 is annealed to form a Palladium silicide (PdSix) layer 50. The anneal is preferably at a temperature between about 230 and 270 ( tgt 250° C.) for a time between about 20 and 40 min (tgt =30 min ) in a $N_2$ or Air ambient.

A key feature of the PdSix layer 40 is that its surface need not be cleaned or treated before electroless deposition. FIG. 1D shows the resultant structure.

Step 110—Pattern PdSix

Step 110, patterns the Palladium (Pd) silicide ( $PdSi_x$) layer 50 by a photolithographic and etch process. A photoresist layer is formed, exposed and developed (not shown). Preferably a dry Etch is used to remove unwanted $PdSi_x$ through the openings in the photoresist layer.

Step 110 also include removing the photoresist used to pattern the PdSix layer 50.

Step 112—Dry Etch of Barrier Layer

Step 112 Dry etches the barrier layer 20 using the PdSix layer 50 as an etch mask.

Step 114—Electroless Deposition of Metal Layer 60

Next, step 114 involves the electroless deposition of metal layer 60. The metal layer can be Pd, Cu or Ni. The processes are described in the tables below. The wafer is preferably immersed in the electroless baths shown below.

TABLE

Important parameters of bath for electroless Cu deposition over metal layer 60

| Composed of Materials | Cu | Low limit | high limit |
|---|---|---|---|
| Thickness | Å | 8000 | 9000 |
| Copper sulphate (Copper sulfate) | grams/Liter (g/L) | 5.8 | 6.2 |
| sodium citrate | g/l | 14.5 | 15.5 |
| Nickel Sulphate | g/l | 0.45 | 0.55 |
| Sodium hypophosphite | g/l | 10.2 | 11.0 |

TABLE

Important parameters of electroless of Ni over metal layer 60

| Composed of Materials | Ni | Low limit | High limit |
|---|---|---|---|
| Thickness | Å | 1800 | 2200 |
| Nickel Chloride | g/l | 28 | 32 |
| sodium hypophosphite | g/l | 7 | 8 |
| Sodium Citrate | g/l | 70 | 75 |
| ammonium chloride | g/l | 45 | 50 |
| pH | | 9.1 | 9.3 |
| Temp | ° C. | 70 | 75 |

TABLE

Electroless Pd solution parameters

| Chemical | units | low limit | high limit |
|---|---|---|---|
| $PdCl_2$ | g/L | 3.6 | 4.4 |
| $NaH_2PO_2 \cdot H_2O$ | g/L | 10.5 | 21 |
| NaOH | ml/L | 10 | 20 |
| pH |  | 8 | 10 |
| Temp | C° | 40 | 50 |

This Pd electroless deposition process is unique to the invention and is important to the process. The use of $NaH_2PO_2$ as a reducing agent provides superior electroless deposition why eliminating unsafe alternative reducing agents.

Embodiment 2—Selective Electroless Depositing using Al, Ti Or Poly Adhesion Layer 130

The second embodiment that forms an interconnect is shown in FIGS. 2A to 2D and 2E. The 2nd embodiment is a process to Selective Electroless Depositing Using Al, Ti or Poly adhesion Layer 130 (or seed layer) to form a metal line or interconnect.

Figure 2A:
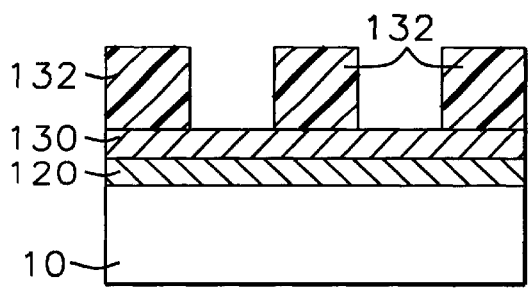
FIGS. 2A through 2D are cross sectional view for explaining the 2nd embodiment of the invention for forming a wire using electroless deposition.

FIG. 2A shows step 202, the Barrier metal layer deposition 120 over the structure. The barrier metal layer can be composed of TiW, MoN, WN, TiN, or TaN, and is most preferably composed of TiW, TiN, or MoN. The barrier metal layer preferably has a thickness in a range of between about 300 and 500 Å. The barrier layer can be formed using a Physical Vapor Deposition (PVD) or chemical vapor deposition process.

FIG. 2A shows the results of the Adhesion layer 130 deposition. The adhesion layer is preferably composed of (a) Poly Si (b) Al or (c) Ti. The composition of the adhesion layer (Poly, Al or Ti) is a key unique feature of the invention. The adhesion layer preferably has a thickness in a range of between about 1000 and 2000 Å.

Next, in step 206, a photoresist (PR) layer 132 is formed over the adhesion layer 132.

In Step 208, the adhesion layer 130 is exposed in the openings of the photoresist layer 132 is cleaned. The pickling and activating (and cleaning) process depends on the composition of the adhesion layer. The table below shows the preferred cleaning processes. Pickling refers to the dipping of a wafer into a pickling solution having composition described in a table below.

TABLE

Pickling/ Activate/Clean surfaces of adhesion layer 130 to be electroless NI deposited upon
(All values shown in tables have +/− 10% limits)

| Adhesion layer | Poly Si | Al | Ti |
|---|---|---|---|
| Pickling step | ①-a pickling solution based on HF | ①-a pickling solution based on NaOH | 2 steps-<br>①-pickling solution based on Nitric acid or HF |
| activation step | ② activation process-activation solution-<br>PdCl2 0.1 to 0.2 g/l<br>HF 200 to 300 g/l<br>acetic acid 450–500 g/l | ②-activating (2 options (a) and (b)<br>(a) PdCl2 activation process-<br>PdCl2 0.1 to 0.2 g/l<br>HF 200 to 300 g/l<br>acetic acid 450–500 g/l<br><br>or<br>(b) ZINC immersion-<br>in a zinc solution<br>NaOH 120 G/L (target)<br>ZnO 10 g/l<br>$C_4H_4 KNaO_6$—4 $H_2O$-50 g/l<br>$NaNO_3$ 1 g/l | ②-activating using Zinc immersion deposition-coats 100 Å of Zn onto Ti adhesion layer<br>NaOH 120 g/L<br>ZnO 10 g/L<br>$C_4H_4 KNaO_6$ 4 $H_2O$ 50 g/l<br>NaNO3 1 g/l |

The key steps to the second embodiment are listed below:

TABLE

Key Steps To The 2nd Embodiment

| Step | FIG. | Reason step is important |
|---|---|---|
| 204 | 2A | using Poly, Al or Ti as adhesion layer 130 (Seed layer) for electroless dep. |
| 208 & 210 | 2b | pretreatment of the surface of the Poly Al, or Ti adhesion layer 130 for selective electroless deposition-includes pickling and activating. |

A semiconductor structure 10 is provided. The semiconductor structure can comprise a semiconductor substrate having devices formed therein and thereover, including, but not limited to conductive and insulating layers and regions.

As with all parameters in this patent that only have one target value (tgt), the target value has limits +/1 10%.

Step 210—Electroless Deposition of Ni, Cu, or Pd

Figure 2B:
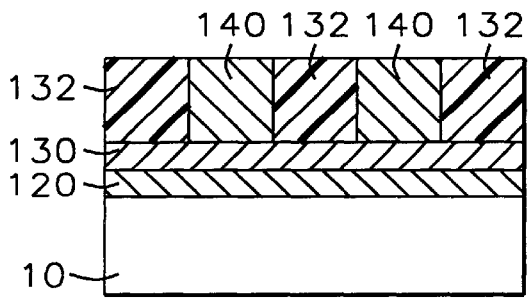

FIG. 2B shows step 208, the electroless deposition of Ni, Cu, or Pd. The deposition process is the same all three of the adhesion layers (poly, Ti, Al) These processes key unique features of the invention.

Step 210 Option A—Electroless Deposition of Ni Over the Adhesion Layer 130

Next, Ni is electroless deposited over the Polysilicon adhesion layer. A nickel layer 140 is deposited by electroless deposition. The Ni is selectively electroless deposited onto the surface of the polysilicon layer forming a Ni layer over the polysilicon layer 130 using the Pd particles as a catalyst. The thickness of electroless Ni film is preferably between about 1800 and 2200 Å. Deposition was conducted in a pH between 9 and 11 (tgt.=10), solution at a temperature between 87 and 93° C. and more preferably about 90° C.

The selectively electroless deposition of Nickel is preferably performed using the four solutions/conditions. The four different solutions form different compositions of the electroless Ni deposited as shown in the table below.

TABLE

The Atomic Percentage Of The Deposited Ni Using The Four Solutions

| solution | Ni (wt %) (+/−1%) | P (wt %) (+/−1%) | B (Wt %) (+/−1%) |
|---|---|---|---|
| 1 | 96 | 4 | 0 |
| 2 | 97 | 0 | 3 |
| 3 | 93.5 | 6.5 | 0 |
| 4 | 91.5 | 8.5 | 0 |

The selectively electroless deposition of Ni is preferably performed at the using the 4 solutions/conditions shown below in the tables.

TABLE

The composition of the Ni-P solution (1)

| The composition of the Ni solution | Low limit | tgt/units | high limit |
|---|---|---|---|
| Nickel sulfate | 25 | 30 g/L | 35 |
| Sodium hypophosphite | 6.5 | 7.5 g/l | 10 |
| Ammonium Chloride | 6 | 8.0 g/L | 10 |
| Ethylene diamine-complexing agent | 50 | 60 g/L | 70 |
| Temperature | 70 | 72° C. | 75 |
| pH | 9.8 | 10 | 10.2 |

TABLE

The composition of the Ni-B solution (2)

| The composition of the Ni solution | Low limit | tgt/units | high limit |
|---|---|---|---|
| Nickel sulfate | 25 | 30 g/L | 35 |
| Dimethylamine borane | 2.5 | 3.0 g/L | 3.5 |
| latic acid-complexing agent | 20 | 25.0 g/L | 30 |
| Citric acid-complexing agent | 20 | 25.0 g/L | 30 |
| Ammonium chloride | 20 | 30 g/L | 40 |
| Thiourea-increases brightness of resulting Ni coating | 0.8 | 1 mg/L | 1.2 |
| Temperature | 56 | 60° C | 65 |
| pH | 5.8 | 6 | 6.2 |

TABLE

The composition of the Ni-P solution (3)

| The composition of the Ni-P solution | Low limit | tgt/units | high limit |
|---|---|---|---|
| Nickel sulfate | 26 | 28 g/L | 30 |
| Sodium citrate | 55 | 60 g/l | 65 |
| Ammonium sulfate | 60 | 65 g/l | 70 |
| Sodium hypophosphite | 16 | 17 g/l | 18 |
| pH | 8.5 | 9.1 | 9.5 |

TABLE

The composition of the Ni-P solution (4)

| The composition of the Ni-P solution | Low limit | tgt/units | high limit |
|---|---|---|---|
| Nickel chloride | 20 | 25 g/l | 30 |
| Sodium hypophosphite | 25 | 27 g/l | 30 |

TABLE-continued

The composition of the Ni-P solution (4)

| The composition of the Ni-P solution | Low limit | tgt/units | high limit |
|---|---|---|---|
| sodium succinate hypophosphite | 12 | 16 g/l | 20 |
| pH | 4.3 | 4.6 | 5.0 |

Key points to the Ni electroless deposition processes of the invention are that this process is suitable for different reducing agents (P or B) and different reducing agent content (low Phosphorous, medium Phosphorus and high phosphorous).

Step 210(Option B)—Electroless Dep of Cu Layer 140 Over the Adhesion Layer The deposition of step 210B selective Electroless deposits Cu over the adhesion layer 130 using the process shown in the table below.

TABLE

Important parameters of electroless of Cu over Adhesion layer 140

| Composed of Materials | Cu | Low limit | high limit |
|---|---|---|---|
| Thickness | Å | 8000 | 9000 |
| Copper sulphate | grams/Liter (g/L) | 5.8 | 6.2 |
| sodium citrate | g/l | 14.5 | 15.5 |
| Nickel Sulphate | g/l | 0.45 | 0.55 |
| Sodium hypophosphite | g/l | 10.2 | 11.0 |

Step 210(Option C)—Electroless Dep of Pd Layer 140 Over the Adhesion Layer 130

Step 210C involves the Electroless deposition of the Pd layer 140 over the adhesion layer 130 using the process in the table below.

TABLE

Electroless Pd solution parameters

| Chemical | units | low limit | high limit |
|---|---|---|---|
| PdCl$_2$ | g/L | 3.6 | 4.4 |
| NaH2PO2 H$_2$O | g/L | 10.5 | 21 |
| NaOH | ml/L | 10 | 20 |
| pH | | 8 | 10 |
| Temp | ° C. | 40 | 50 |

This Pd electroless deposition process is unique to the invention and is important to the process.

Figure 2C:
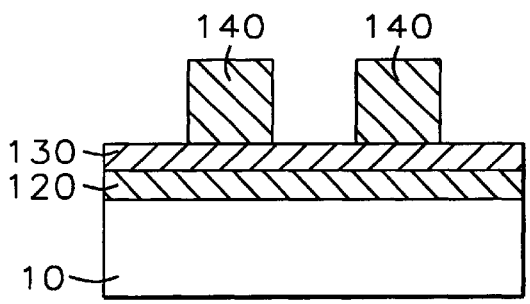

FIG. 2C shows the removal of the photoresist layer 132. The photoresist layer is preferably removed using O$_2$ ashing.

Figure 2D:
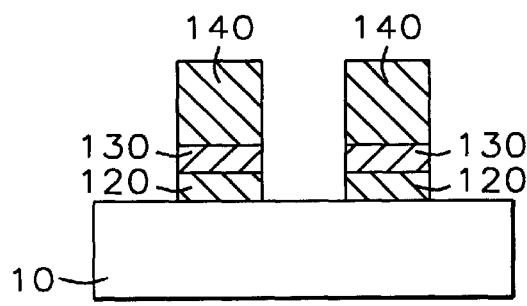
Figure 2E:
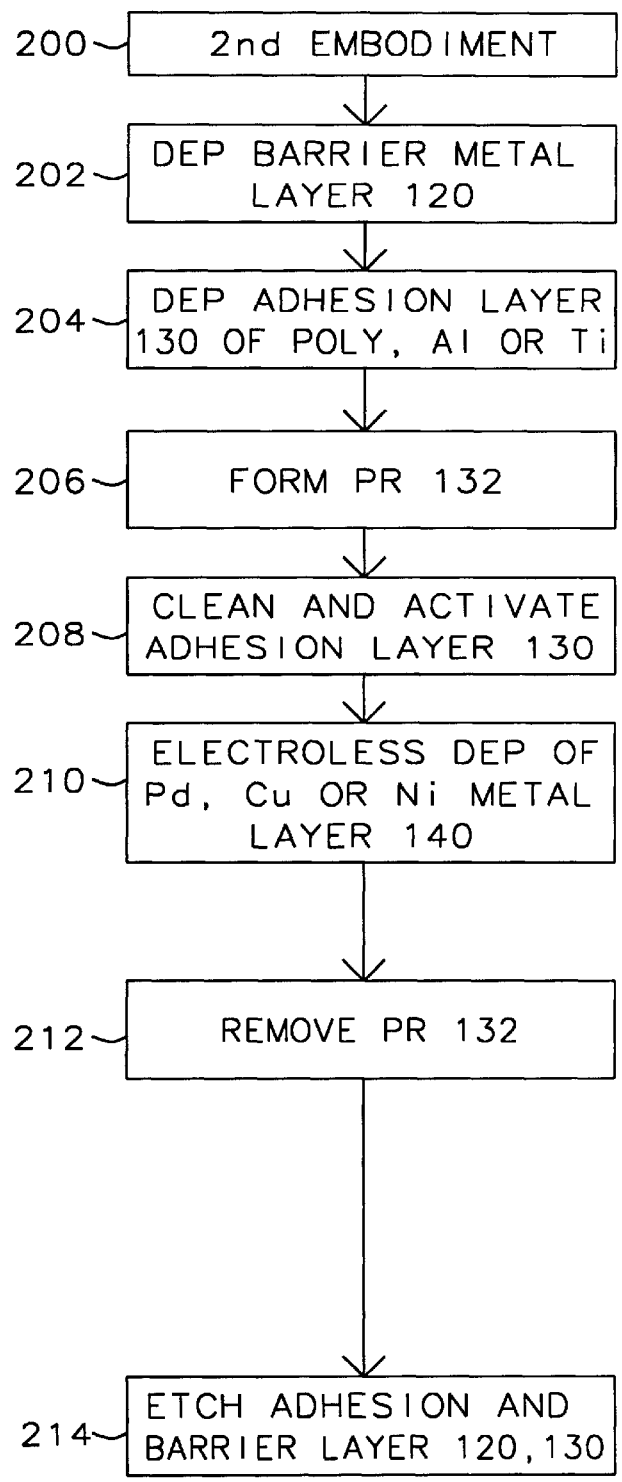
FIG. 2E is a flow chart of the process of the 2nd embodiment of the invention for forming a wire using electroless deposition.

FIG. 2D shows a dry etch to remove adhesion layer and barrier layer exposed between the electroless metal layer 140.

Figure 2F:
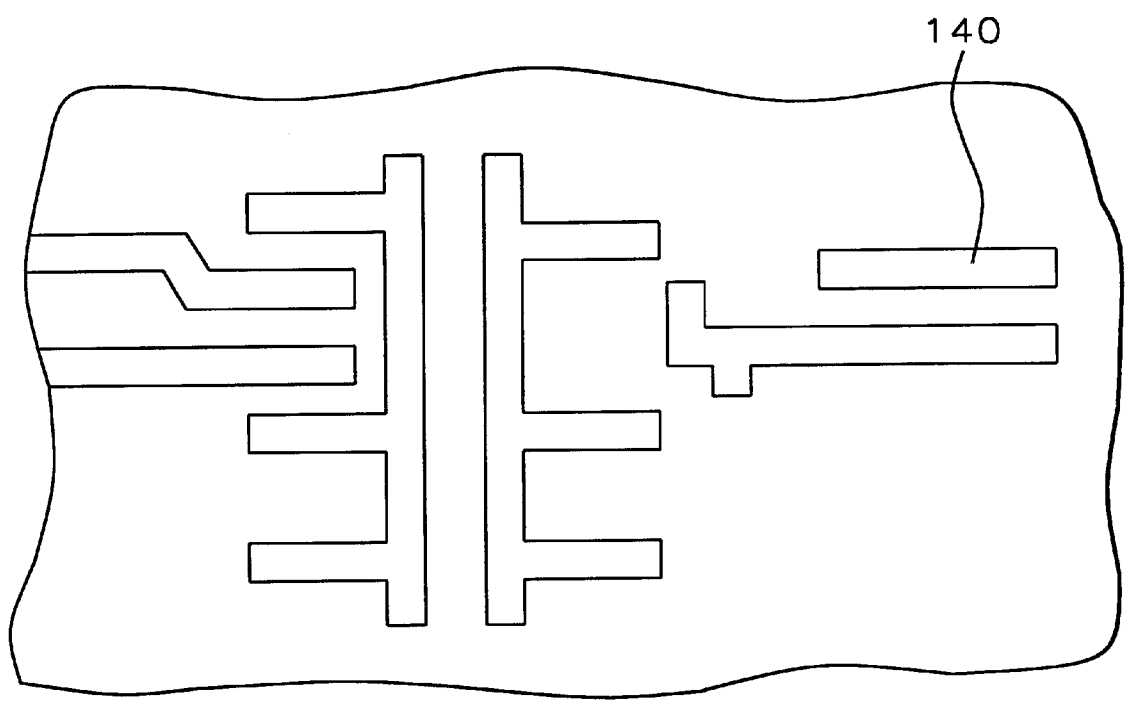
FIG. 2F is a top plan view for illustrating the 1st and 2nd embodiments of the invention for forming a wire using electroless deposition.

FIG. 2F shows a top down view of a interconnect or metal line 140 formed by the first or second embodiments of the invention.

Embodiment 3—Solder Bump—Polish to Roughen Barrier Layer

The third embodiment uses a metal barrier layer, activated by CMP, to electroless deposit a Cu, Ni or Pd layer and then form a Pb—Sn bump thereover. The third embodiment of the invention forms a solder bump as shown in FIGS. 3A to 3D and flow chart FIG. 3F.

TABLE

Summary of Key steps in the 3rd embodiment

| Step number | FIG. | Reason step is novel |
|---|---|---|
| 306 | 3B | using chemical-mechanical polish to roughen and activate the surface |
| 314 | 3E | using electroless deposited layer 240 as an adhesion layer for the solder bump 250. |

The third embodiment is summarized in the table below:

TABLE

Summary of 3rd Embodiment-electroless depositing using CMP roughing of adhesion layer

Figure 3A:
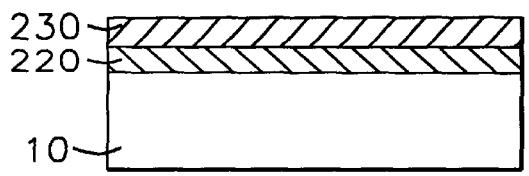
FIGS. 3A through 3E are cross sectional view for explaining the 3rd embodiment of the invention for forming a solder bump using electroless deposition.
Figure 3B:
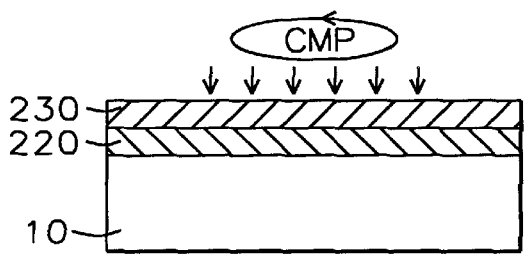
Figure 3C:
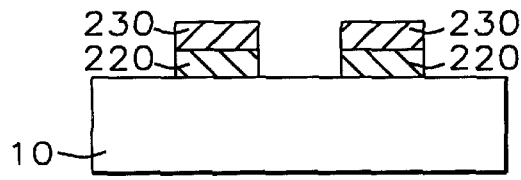
Figure 3D:
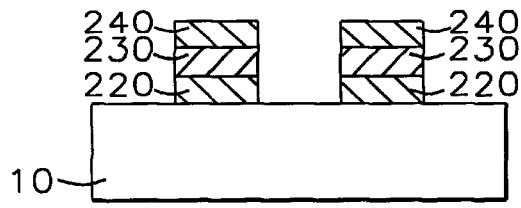

| FIG. and step | Process |
|---|---|
| FIG. 3A-step 302, | depositing an Aluminum layer 220 over the semiconductor structure 10; |
| FIG. 3A step 304,- | depositing a barrier metal layer 230 over the Aluminum layer 220; the barrier metal layer is composed of TiW, TiN, MoN, WN, or TaN; |
| FIG. 3B-step 306, | polishing the barrier layer 230 to roughen the surface of the barrier layer; the polishing comprises using a Slurry of 0.3 $\mu$M Al2O3 powder at a Speed of about 300 RPM (+/−10%); |
| FIG. 3C-8- | Patterning the aluminum layer 220 and the barrier metal layer 230; |
| FIG. 3D-step 310- | pickling the surface of the barrier layer using an HF based pickling solution; |
| FIG. 3D step 310- | activating the surface of the barrier layer using a PdCl$_2$ activation solution comprised of: PdCl2 at a concentration between about 0.1 and 0.2 g/l, HF at a concentration between about 200 and 300 g/l, and acetic acid at a concentration between about 450 and 500 g/l; |
| Fig 3D-step 312- | electroless depositing a metal layer 240 over the barrier layer 230; |
| FIG. 3E-Step 314- | depositing a Solder bump 250 over the electroless metal layer 240; the solder bump is compose of Pb–Sn. |

A semiconductor structure 10 is provided. The semiconductor structure can comprise a semiconductor substrate having devices formed therein and thereover, including, but not limited to conductive and insulating layers and regions.

FIG. 3A shows step 302, the deposition of the Aluminum layer 230. The Al layer 230 is formed as shown in the table below.

TABLE

Preferred process parameters for the Al metal layer 230

| composition (Al) | units | Low | tgt | hi |
|---|---|---|---|---|
| Process type-Thickness | sputter Å | 17500 | 18000 | 18,500 |
| pressure | mtorr | 7 | 7.5 | 8.0 |
| temperature | ° C. | 290 | 300 | 310 |

The aluminum layer 230 can be composed of Al or Al—Si or Al—Si—Cu alloy.

Step 304—Barrier Metal Deposition

FIG. 3A shows the results of step 304, the deposition of the barrier metal layer 230. The barrier metal layer can be composed of TiW, TiN, MoN, WN, or TaN. The barrier metal layer preferably had a thickness in a range of between about 1000 and 1400 Å.

Step 306—CMP or Polish

FIG. 3B shows step 306, the chemical-mechanical polish (CMP) or polish process which designed to roughen the surface of the barrier layer 230. This step is critical in improving the activation step (see step 306). The polish process preferably comprises a grinding using Slurry of 0.3 $\mu$m Al$_2$O$_3$ powder and at a Speed of about 300 RPM (+/−10%).

Step 306—Activation Step—(Optional)

The adhesion layer is activated (optional—can be performer after patterning step 308) using the following two step process comprising: ①—a pickling solution based on HF, and ② activation process—activation solution—comprising: PdCl2 0.1 to 0.2 g/l, HF 200 to 300 g/l and acetic acid 450–500 g/l. This activation step in combination with CMP step 306 is important for the electroless deposition step 312.

FIG. 3C shows step 308, the patterning of the Al layer 220 and the barrier layer 230 The patterning comprises forming a photoresist layer with opening over the barrier layer and dry etching the Al and barrier layers.

FIG. 3D step 310 shows the second activation of the barrier layer using a activation solution. The preferred activation solution is shown below.

TABLE preferred activation solution:

| chemical | units | low limit | High limit |
|---|---|---|---|
| PdCl2 | g/L | 0.1 | 0.2 |
| HF | g/L | 200 | 300 |
| acetic acid | g/L | 450 | 550 |

Step 312—Electroless Deposition of Metal 240 on the CMP Roughened Barrier Layer 230

FIG. 3D, Step 312 shows the Electroless deposition of a metal layer 240 composed of Cu, or Ni or Pd. The selective electroless depositing process for Cu, Ni and Pd, is preformed as described above in the second embodiment.

The metal layer 240 composed of Cu is preferably formed by a two step process comprising ① a Physical Vapor Deposition (PVD) (Sputtering) forming a Cu seed layer (not shown) with a thickness of about 500 Å over the barrier layer 230 and then ② electroplating or electroless depositing Cu over the Cu (PVD) seed layer.

Step 314—Solder Bump Deposition

Figure 3E:
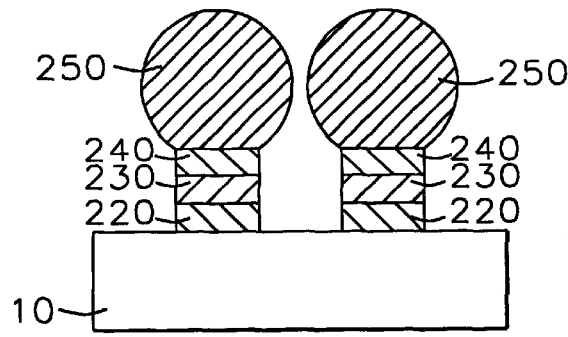
Figure 3F:
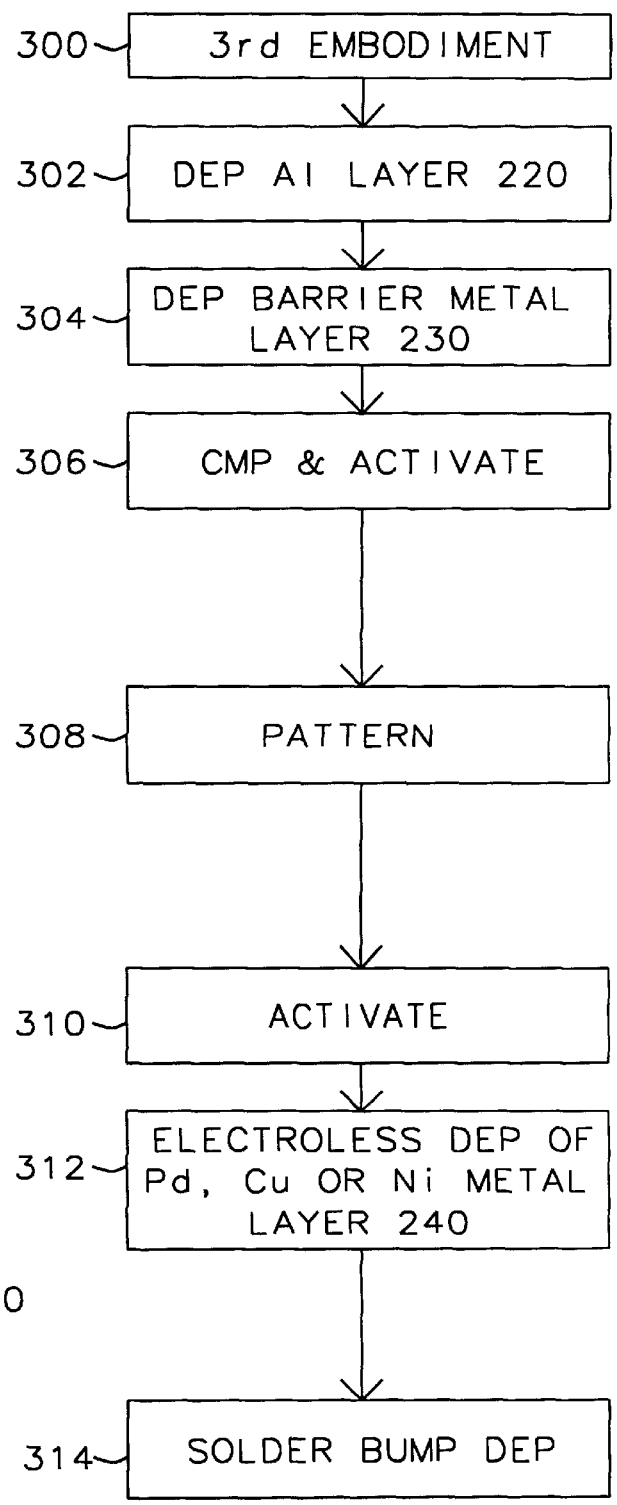
FIG. 3F is a flow chart of the process of the 3rd embodiment of the invention for forming a solder bump using electroless deposition.

FIG. 3E shows the Solder bump deposition 250 over the metal layer 240. The solder bump 250 is preferably compose of lead-tin alloy and preferably has a thickness in a range of between about 25 and 50 $\mu$m. The solder bump is about 100 $\mu$m wide on etch side.

SUMMARY OF KEY POINTS OF THE 3 EMBODIMENTS

The invention has 3 preferred embodiments. The first embodiment forms metal lines or interconnects. The key features/steps of the first embodiment are: step 108—PdSix layer 50 The table below indicates the key steps and their importance.

TABLE important elements of the interconnect of the first embodiment

| Step | FIG. | Reason step is important |
|------|------|--------------------------|
| 108 | 1c | PdSix layer 50 is superior catalytic material for electroless deposition |
|  |  | The salicidation temperature is low and reaction can proceed in a oxygen atmosphere |
| 114 | 1E | Electroless Cu or Ni can selectively deposit on PdSix |

The 1st embodiment solves the problems of: forming the silicide layer on the surface of refractory metal or contact hole and then the electroless plating can easily selectively deposited metal on the exposed PdSix region.

The second embodiment forms another metal line. The key features/steps of the second embodiment are:

| Step | FIG. | Reason step is important |
|------|------|--------------------------|
| 204 | 2A | using Poly, Al or Ti as adhesion layer 130 |
| 208 & 210 | 2B | pretreatment of the surface of the Poly Al, or Ti adhesion layer 130 for electroless dep-includes pickling and activating. |

The second embodiments using Al, Poly or Ti material as a seed material, (Adhesion layer 130). The metal is selectively electroless deposited over the adhesion layer. Also important is the pickeling and activating or zincating process. The 2nd embodiment is very simple and compatible with conventional IC processing.

The third embodiment forms a solder bump. The key features/steps of the third embodiment are: ① chemical-mechanical polish of the refectory metal layer 230 (FIG. 3B, step 306) in order to increase absorption. First, the electroless Ni deposited or Cu has a superior solderable property. Second, the process save one mask step, since the selective metal deposition 312 makes it unnecessary to form a mask.

While the invention has been particularly shown and described with reference to the preferred embodiments thereof, it will be understood by those skilled in the art that various changes in form and details may be made without departing from the spirit and scope of the invention.

What is claimed is:

1. A method for forming an interconnect by depositing selectively by electroless deposition a metal using a palladium silicide seed layer comprising the steps of:
  a) providing a semiconductor structure;
  b) forming a barrier layer over said semiconductor structure;
  c) forming an adhesion layer over said barrier metal layer, said adhesion layer is comprised of polysilicon;
  d) sputter depositing a palladium layer over said adhesion layer;
  e) annealing said palladium layer to form a palladium silicide layer;
  f) patterning said palladium silicide layer to form palladium silicide interconnect patterns;
  g) patterning said barrier layer using said palladium silicide interconnect patterns as an etch mask forming barrier layer interconnect patterns;
  h) selectively electroless depositing a metal layer on said palladium silicide line patterns to form an interconnect; said metal layer composed of a material selected from the group consisting of Ni, Cu, and palladium, whereby said metal layer was deposited without activating said palladium silicide line.

2. The method of claim 1 wherein step h) further includes the selectively electroless depositing said metal layer is composed of Cu has a thickness in a range of between about 8000 and 9000 Å and is performed in a electroless solution consisting of: water, copper sulphate at a concentration between about 5.8 and 6.2 grams/Liter (g/L), sodium citrate at a concentration between 14.5 and 15.5 g/l, nickel sulphate at a concentration between 0.45 and 0.55 g/l, and sodium hypophosphite at a concentration between 10.2 and 11.0 g/l.

3. The method of claim 1 wherein step h) further includes the selectively electroless depositing said metal layer 60 composed of Ni having a thickness in a range of between about 1800 and 2200 Å, and is performed in a electroless solution consisting of: water, nickel chloride at a concentration between 28 and 32 g/l, sodium hypophosphite at a concentration between 7 and 8 g/l, sodium citrate at a concentration between 70 and 75 g/l, ammonium chloride at a concentration between 45 and 50 g/l, at a pH between 9.1 and 9.3, and at a temperature between 70 and 75° C.

4. The method of claim 1 wherein step h) further includes the selectively electroless depositing said metal layer is composed of palladium, and is performed in a electroless solution consisting of: water, $PdCl_2$ at a concentration between about 3.6 and 4.4 g/l, $NaH_2PO_2H_2O$ at a concentration between about 10.5 and 21 g/l, NaOH at a concentration between about 10 and 20 ml/l, and a pH between 8 and 10 and at a temperature between 40 and 50° C.

5. The method of claim 1 wherein the anneal to form said palladium silicide layer is performed at a temp between about 230 and 270° C. for a time between about 20 to 40 minutes; the anneal is performed in an ambient selected from the group consisting of $N_2$ and air.

6. The method of claim 1 wherein said barrier metal layer of a material selected from the group consisting of TiW, TiN, MoN, WN, and TaN.

7. The method of claim 1 wherein said palladium layer having a thickness in a range of between about between about 2000 and 2500 Å.

8. A method for forming an interconnect by depositing selectively by electroless deposition a metal using a palladium silicide seed layer comprising the steps of:
  a) providing a semiconductor structure;
  b) forming a barrier layer over said semiconductor structure;
    (1) said barrier metal layer is composed of a material selected from the group consisting of TiW, TiN, MoN, WN, and TaN.
  c) forming an adhesion layer over said barrier metal layer, said adhesion layer composed of polysilicon;
  d) sputter depositing a palladium layer over said adhesion layer;
  e) annealing said palladium layer to form a palladium silicide layer;
    (1) the anneal to form said palladium silicide layer is performed at a temp between about 230 and 270° C. for a time between about 20 to 40 minutes; the anneal is performed in an ambient selected from the group consisting of $N_2$ and air;

f) patterning said palladium silicide layer to form palladium silicide interconnect patterns;

g) patterning said barrier layer using said palladium silicide interconnect patterns as an etch mask forming barrier layer interconnect patterns;

h) selectively electroless depositing a metal layer on said palladium silicide interconnect patterns to form an interconnect; said metal layer composed of a material selected from the group consisting of Ni, Cu, and palladium, whereby said metal layer was deposited without activating said palladium silicide line.

9. The method of claim 8 wherein step h) further includes the selectively electroless depositing said metal layer is composed of Cu having a thickness in a range of between about 8000 and 9000 Å and is performed in a electroless solution comprising: copper sulphate at a concentration between about 5.8 and 6.2 grams/Liter (g/L), sodium citrate at a concentration between 14.5 and 15.5 g/l, nickel sulphate at a concentration between 0.45 and 0.55 g/l, and Sodium hypophosphite at a concentration between 10.2 and 11.0 g/l.

10. The method of claim 8 wherein step h) further includes the selectively electroless depositing said metal layer is composed of Ni having a thickness in a range of between about 1800 and 2200 Å, and is performed in a electroless solution comprising: nickel chloride at a concentration between 28 and 32 g/l, sodium hypophosphite at a concentration between 7 and 8 g/l, sodium citrate at a concentration between 70 and 75 g/l, ammonium chloride at a concentration between 45 and 50 g/l, at a pH between 9.1 and 9.3, and at a temperature between 70 and 75° C.

11. The method of claim 8 wherein step h) further includes the selectively electroless depositing said metal layer is composed of palladium, and is performed in an electroless solution comprising: $PdCl_2$ at a concentration between about 3.6 and 4.4 g/l, $NaH_2PO_2$ $H_2O$ at a concentration between about 10.5 and 21 g/l, NaOH at a concentration between about 10 and 20 ml/l, and a pH between 8 and 10 and at a temperature between 40 and 50° C.

12. A method for forming an interconnect by depositing selectively by electroless deposition a metal using a palladium silicide seed layer comprising the steps of:

a) providing a semiconductor structure;

b) forming a barrier layer over said semiconductor structure;
   (1) said barrier metal layer is composed of a material selected from the group consisting of TiW, TiN, MoN, WN, and TaN;

c) forming an adhesion layer over said Barrier metal layer, said adhesion layer composed of polysilicon;

d) sputter depositing a palladium layer over said adhesion layer;

e) Annealing said palladium layer to form a palladium silicide layer;
   (1) the anneal to form said palladium silicide layer is performed at a temp between about 230 and 270° C. for a time between about 20 to 40 minutes; the anneal is performed in an ambient selected from the group consisting of $N_2$ and air;

f) patterning said palladium silicide layer to form palladium silicide interconnect patterns;

g) patterning said barrier layer using said palladium silicide interconnect patterns as an etch mask forming barrier layer interconnect patterns; and h) selectively electroless depositing a metal layer on said palladium silicide interconnect patterns to form an interconnect; said metal layer is comprised of Cu and has a thickness in a range of between about 8000 and 9000 Å; the selectively electroless depositing of said metal layer is performed in a electroless solution comprising: copper sulphate at a concentration between about 5.8 and 6.2 grams/Liter (g/L), sodium citrate at a concentration between 14.5 and 15.5 g/l, nickel sulphate at a concentration between 0.45 and 0.55 g/l, and sodium hypophosphite at a concentration between 10.2 and 11.0 g/l; whereby said metal layer was deposited without activating said palladium silicide line.

13. A method for forming an interconnect by depositing selectively by electroless deposition a metal using a palladium silicide seed layer comprising the sequence steps of:

a) providing a semiconductor structure; then b) forming a barrier layer over said semiconductor structure; then c) forming an adhesion layer over said barrier metal layer, said adhesion layer is comprised of polysilicon; then d) sputter depositing a palladium layer over said adhesion layer; then e) annealing said palladium layer to form a palladium silicide layer; then f) patterning said palladium silicide layer to form palladium silicide interconnect patterns; then g) patterning said barrier layer using said palladium silicide interconnect patterns as an etch mask forming barrier layer interconnect patterns; then h) selectively electroless depositing a metal layer on said palladium silicide line patterns to form an interconnect; said metal layer composed of a material selected from the group consisting of Ni, Cu, and palladium, whereby said metal layer was deposited without activating said palladium silicide line.

14. A method for forming an interconnect by depositing selectively by electroless deposition a metal using a palladium silicide seed layer comprising the sequence steps of:

a) providing a semiconductor structure; then b) forming a barrier layer over said semiconductor structure; then
   (1) said barrier metal layer is composed of a material selected from the group consisting of TiW, TiN, MoN, WN, and TaN;

c) forming an adhesion layer over said barrier metal layer, said adhesion layer composed of polysilicon; then d) sputter depositing a palladium layer over said adhesion layer; then e) annealing said palladium layer to form a palladium silicide layer; then
   (1) the anneal to form said palladium silicide layer is performed at a temp between about 230 and 270° C. for a time between about 20 to 40 minutes; the anneal is performed in an ambient selected from the group consisting of $N_2$ and air;

f) patterning said palladium silicide layer to form palladium silicide interconnect patterns; then g) patterning said barrier layer using said palladium silicide interconnect patterns as an etch mask forming barrier layer interconnect patterns; then h) selectively electroless depositing a metal layer on said palladium silicide interconnect patterns to form an interconnect; said metal layer composed of a material selected from the group consisting of Ni, Cu, and palladium, whereby said metal layer was deposited without activating said palladium silicide line.

* * * * *